United States Patent
Strange et al.

(10) Patent No.: US 8,225,475 B2
(45) Date of Patent: Jul. 24, 2012

(54) ALIGNMENT DEVICE FOR FINE PITCH CONNECTOR LEADS

(75) Inventors: Andrew Strange, Arden Hills, MN (US); Aaron Heitzman, Ramsey, MN (US)

(73) Assignee: Omnetics Connector Corporation, Minneapolis, MN (US)

( * ) Notice: Subject to any disclaimer, the term of this patent is extended or adjusted under 35 U.S.C. 154(b) by 873 days.

(21) Appl. No.: 12/316,145

(22) Filed: Dec. 10, 2008

(65) Prior Publication Data
US 2010/0140440 A1     Jun. 10, 2010

(51) Int. Cl.
*B60R 11/02* (2006.01)

(52) U.S. Cl. ......... 29/281.5; 29/281.1; 29/271; 29/270

(58) Field of Classification Search ............... 29/281.1, 29/281.5, 283.5, 270, 271, 242, 243; 248/581; 269/3, 6, 95, 32, 909
See application file for complete search history.

(56) References Cited

U.S. PATENT DOCUMENTS

| | | | |
|---|---|---|---|
| 3,953,099 A | 4/1976 | Wilson | |
| 4,395,585 A | 7/1983 | Polcyn | |
| 4,550,962 A * | 11/1985 | Czeschka | 439/78 |
| 4,692,599 A | 9/1987 | Howard et al. | |
| 4,734,042 A * | 3/1988 | Martens et al. | 439/62 |
| 4,860,439 A | 8/1989 | Riley | |
| 4,894,015 A | 1/1990 | Stockero et al. | |
| 4,986,772 A | 1/1991 | Fukutani | |
| 4,996,583 A | 2/1991 | Hatada | |
| 5,115,904 A | 5/1992 | Folk et al. | |
| 5,124,534 A | 6/1992 | Williams et al. | |
| 5,129,832 A | 7/1992 | Marsh et al. | |
| 5,176,366 A * | 1/1993 | Masumoto et al. | 257/670 |
| 5,235,407 A | 8/1993 | Spigarelli et al. | |
| 5,281,851 A | 1/1994 | Mills et al. | |
| 5,313,368 A * | 5/1994 | Volz et al. | 361/774 |
| 5,351,821 A * | 10/1994 | Skrtic | 206/714 |
| 5,439,385 A | 8/1995 | Sakai et al. | |
| 5,471,097 A * | 11/1995 | Shibata | 257/787 |
| 5,526,974 A | 6/1996 | Gordon et al. | |
| 5,730,630 A * | 3/1998 | Lacourse et al. | 439/876 |
| 5,750,422 A | 5/1998 | Mills et al. | |
| 5,876,222 A | 3/1999 | Gardner | |
| 6,247,690 B1 * | 6/2001 | Wolf | 269/277 |
| 6,339,191 B1 | 1/2002 | Crane | |
| 6,462,408 B1 * | 10/2002 | Wehrly, Jr. | 257/686 |
| 6,608,763 B1 * | 8/2003 | Burns et al. | 361/790 |
| 6,764,316 B1 * | 7/2004 | Yu | 439/79 |
| 7,195,497 B2 | 3/2007 | Hull et al. | |
| 7,259,452 B2 * | 8/2007 | Wehrly et al. | 257/685 |
| 7,375,418 B2 * | 5/2008 | Partridge | 257/685 |

FOREIGN PATENT DOCUMENTS

JP          405267522 A    10/1993

* cited by examiner

*Primary Examiner* — Lee D Wilson
(74) *Attorney, Agent, or Firm* — Sherrill Law Offices, PLLC

(57) ABSTRACT

A non-conductive stabilizer bar device for aligning and stabilizing fine pitch electronic components, specifically a nano-miniature connector, while these components are being mounted to a printed circuit board. The stabilizer bar device provides for alignment and stability in the all directions. The stabilizer bar device provides a series of grooves having detents that come into contact with fine pitch electronic leads and hold fast the fine pitch electronic leads providing stability by maintaining the true positioning of the terminal ends of the contacts.

11 Claims, 6 Drawing Sheets

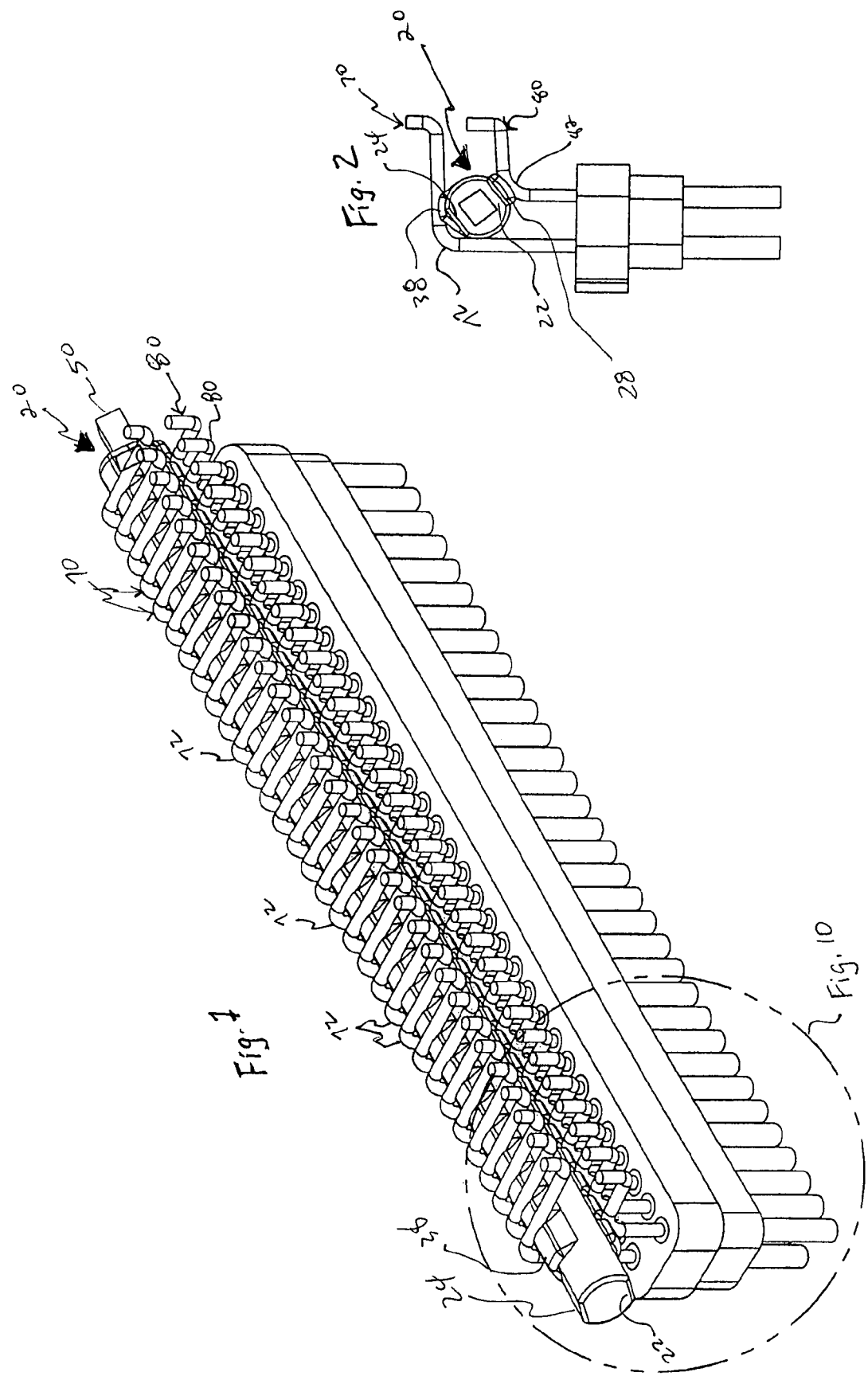

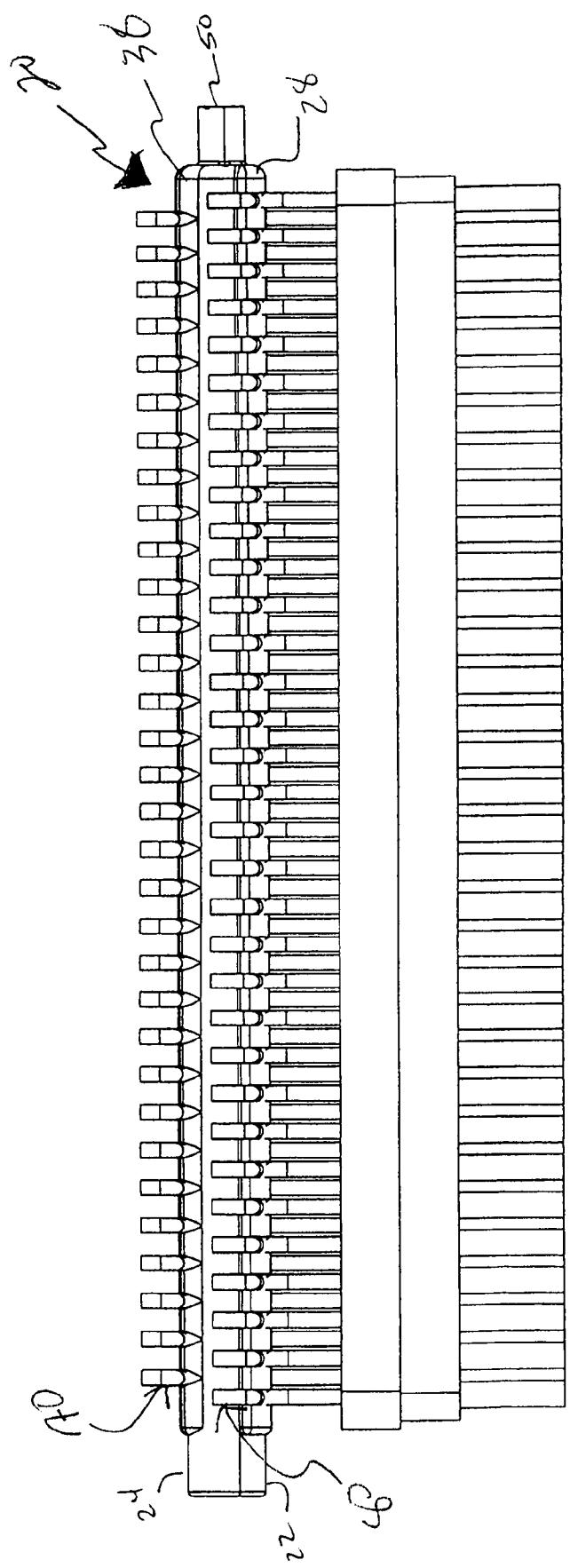

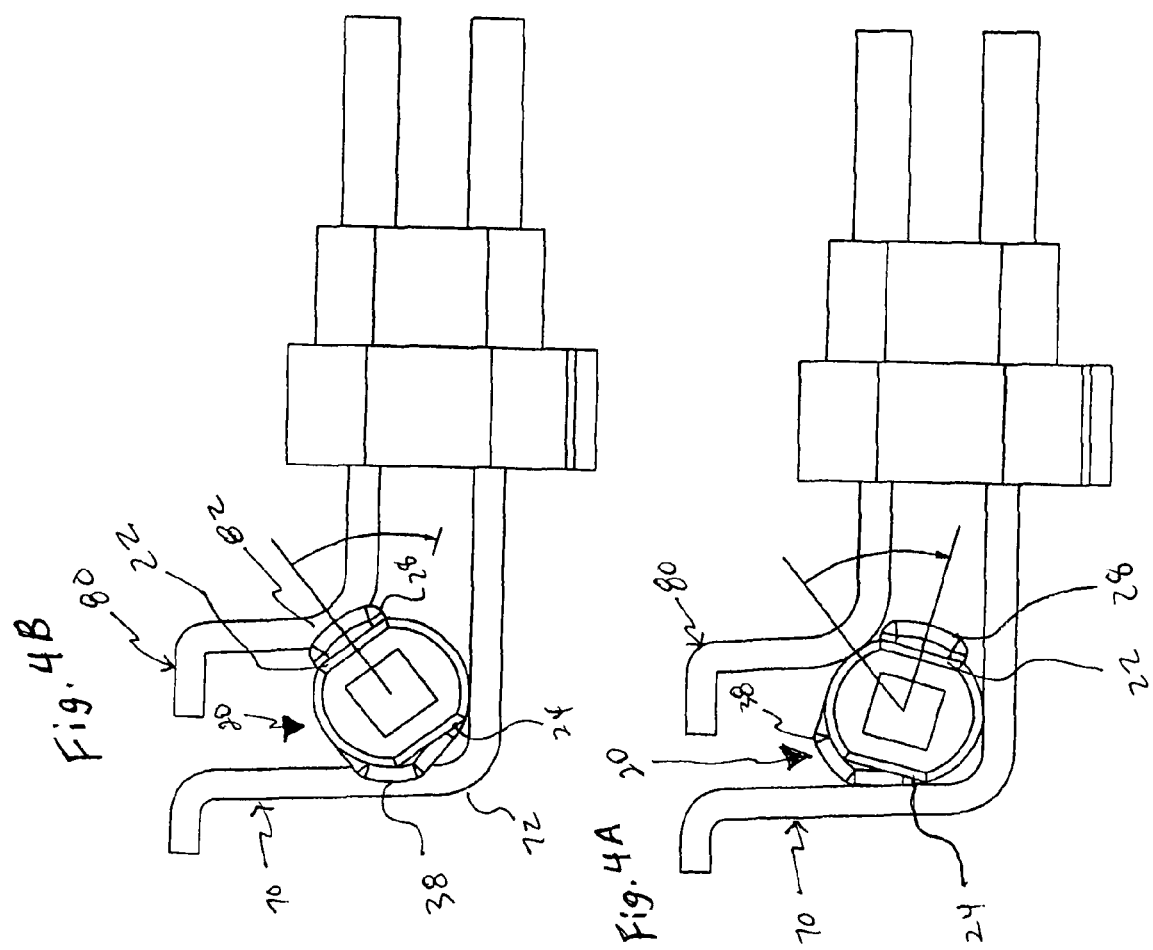

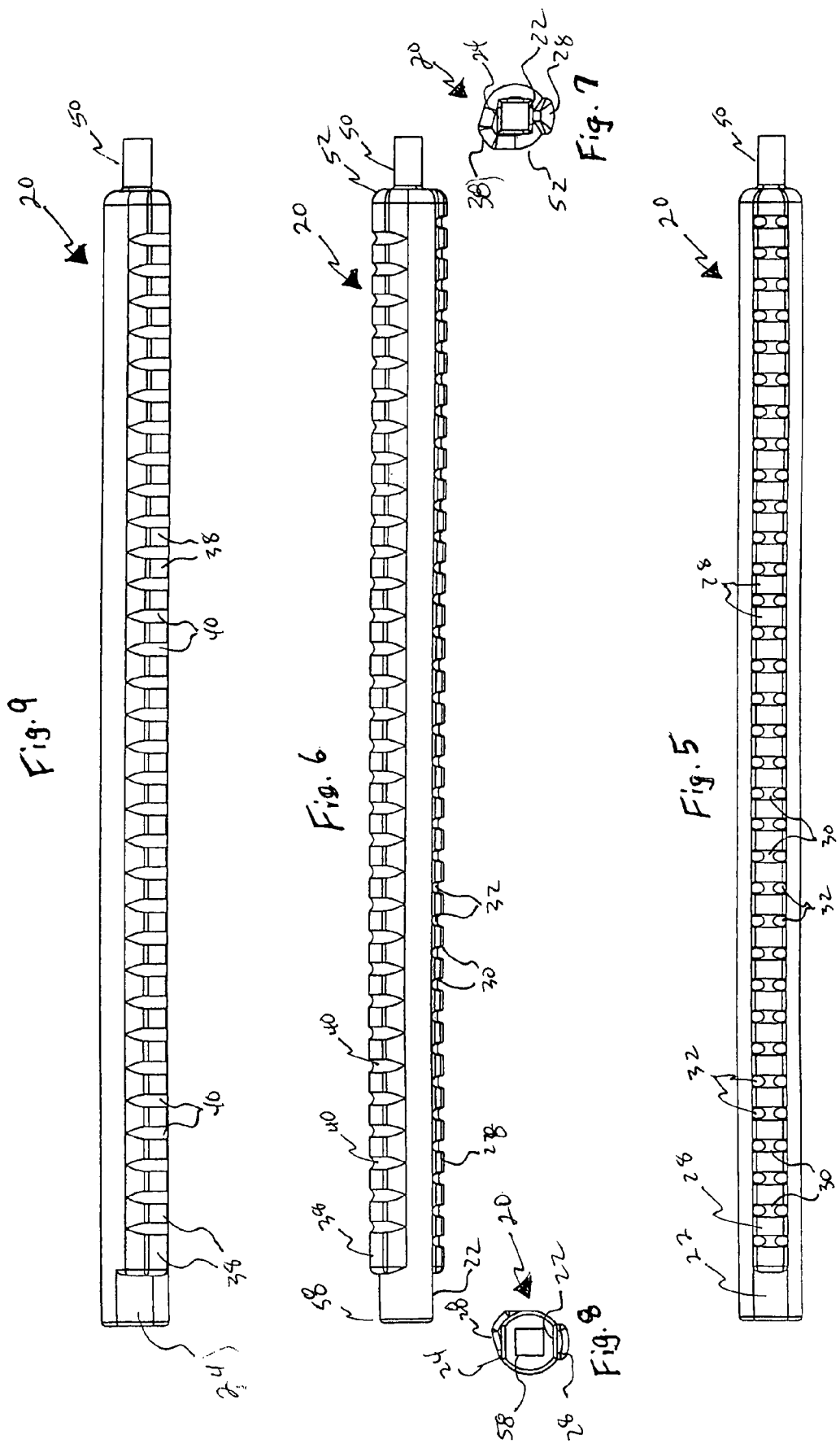

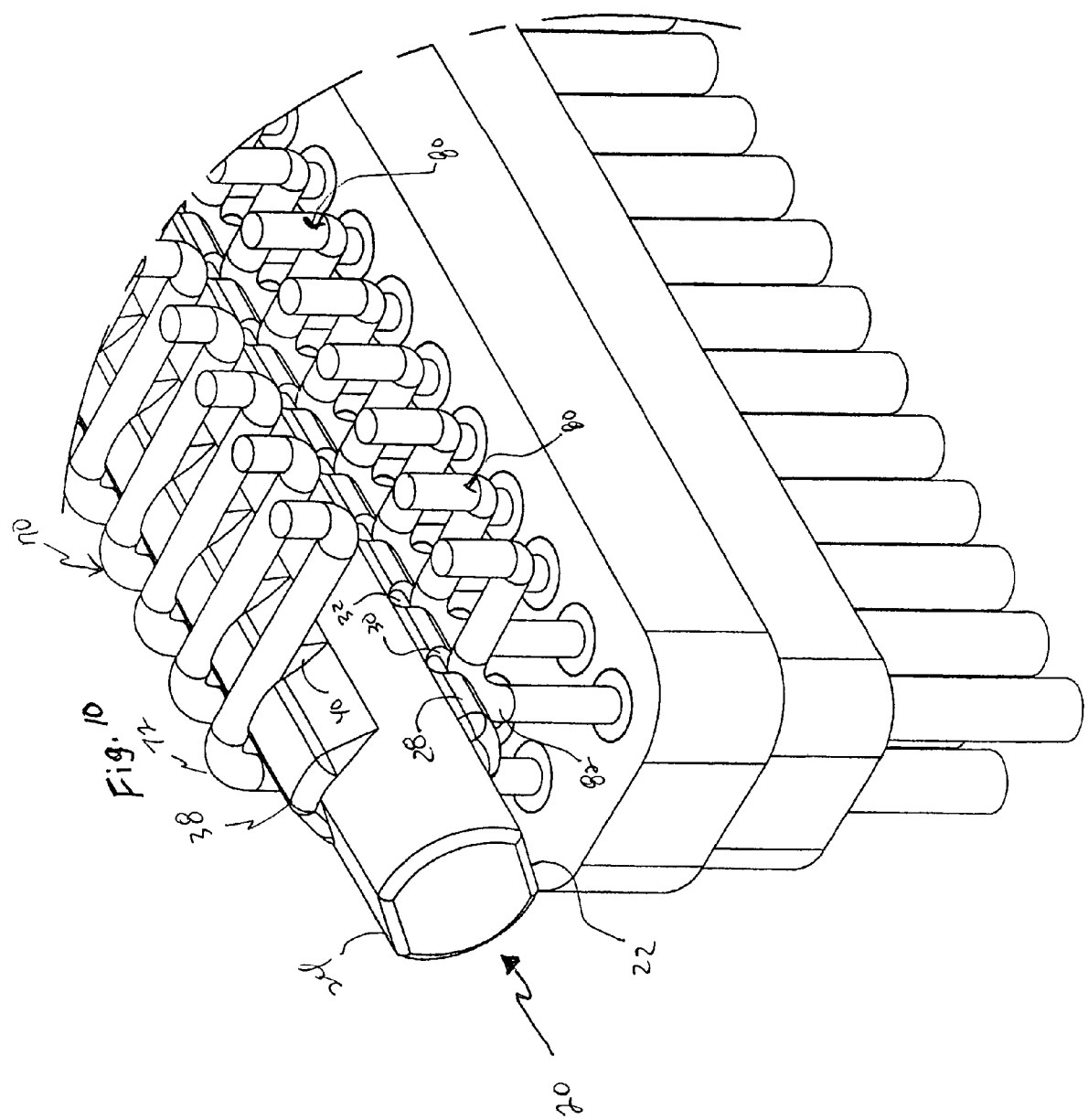

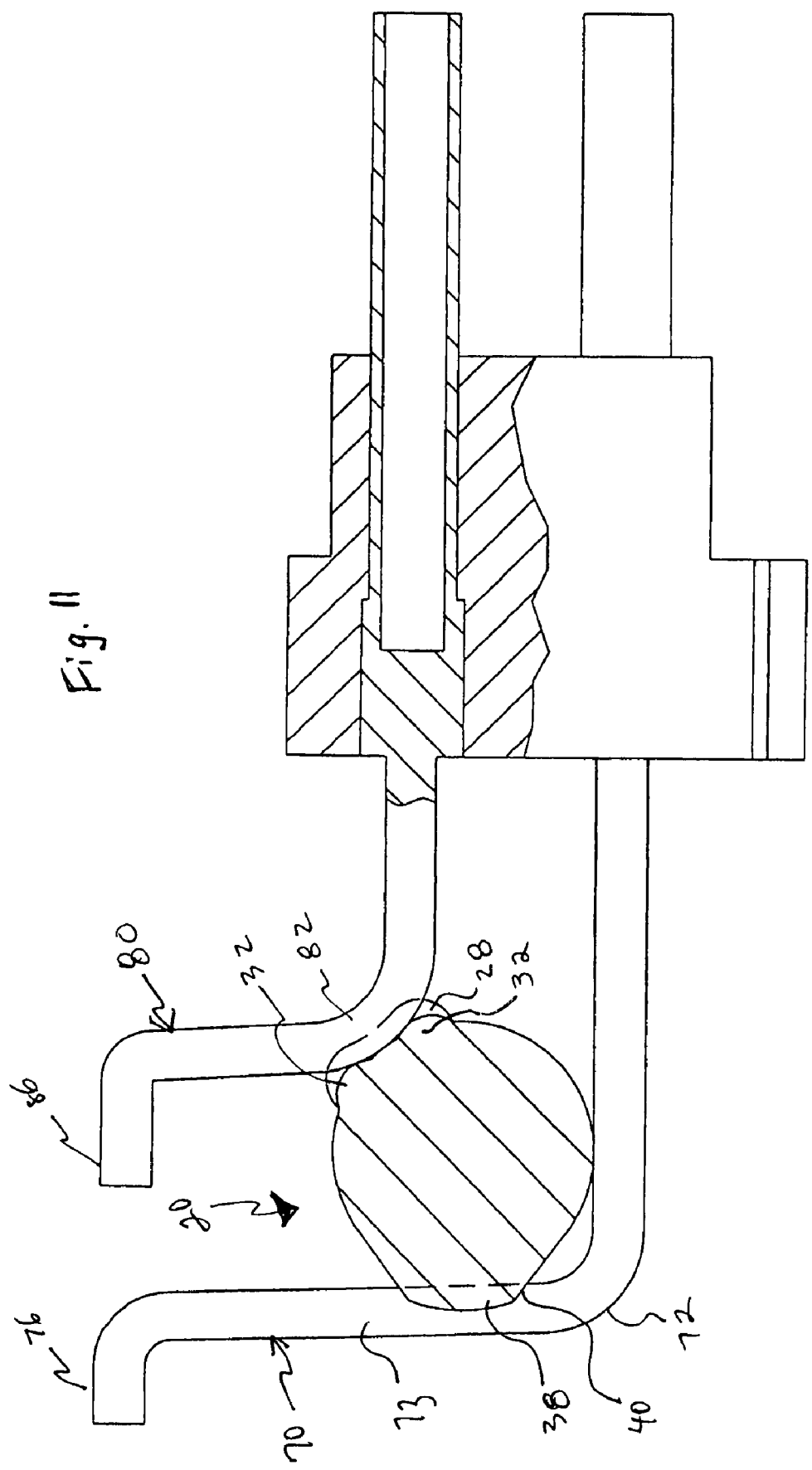

ALIGNMENT DEVICE FOR FINE PITCH CONNECTOR LEADS

BACKGROUND

This application is a non-provisional application filed under 35 U.S.C. §111(a).

The present invention is directed generally to micro connector leads and specifically to a stabilizer bar device that aligns and stabilizes the position between the assembled connector leads prior to the micro connector leads being mounted onto a printed circuit board or other electronic device.

Integrated circuit devices are generally planar and have a plurality of leads projecting laterally and generally downwardly there from. The leads are eventually soldered to circuit boards or other electronic devices. Difficulties are encountered in soldering the leads to a circuit board for a number of reasons, including the leads are not always bent uniformly, and because the adjacent lead is relatively close, that is, the leads have a fine pitch. Individual leads are easily deformed during packaging, shipping and handling. Prior art manufacturing methods have required significant time to manually align the leads to the eventual structure, such as a circuit board, after connector has been assembled.

Devices that give additional support for electrical component leads include the use of additional conductive material that is added between the leads and the circuit board. A problem with this solution is this can lead to shorting out of the devices in question. Another attempt to solve this problem of lack of support has been to add a spacer connector device between leads to thermally couple adjacent IC packages in a stacked configuration.

While these arts may be appropriate for their specific purposes, they do not provide stability of the connector leads for ease of connection to a circuit board without the need to manually align the individual leads, nor do they isolate the electrical connectors from other structures. Additionally these prior arts do not provide an insulator between the connector leads to keep the leads electrically independent.

SUMMARY

The present invention provides a stabilizer bar element of non-conducting material for insertion between paired rows of electronic connector leads. This stabilization bar element is especially useful with fine pitch electronic components, also known as nanominiature connector leads. When the stabilizer bar is oriented into an engagement position, the stabilizer bar attaches to and holds fast to each lead in the rows of leads in a paired configuration which protects the individual connector leads from being deformed during shipping and use.

An alignment and stabilizer bar device of non-conducting material is here provided to be added to a paired nanominiature connector lead. The stabilizer bar secures the fine pitch leads associated with the nanominiature electrical components in position to prevent deformation of the leads during shipment, storage and use, where such deformation could result in an electrical short within an electrical device or misalignment results in failed assembly to the circuit board. The alignment and stabilizer bar is separate from the nanominiature connector leads. This stabilizer bar is a length of non-conductive material that has formed therein evenly spaced grooves on one long side and evenly spaced cutouts on another long side of the bar each groove and cutout for receiving nanominiature connector leads. The stabilizer bar is particularly useful when paired with nanominiature connector leads. The lead rows in nanominiature connectors are intentionally produced with a configuration such that the individual rows of leads are closer together than ultimately desired. The addition of the stabilizer bar biases or deflects these leads into the desired alignment for installation onto a circuit board or other device.

A single stabilizer bar has grooves and cutouts formed along the length of two sides of the longitudinal element stabilizer bar. The grooves and cutouts align with the paired electrical connectors such that where the stabilizer bar is oriented into an engagement position with the paired leads, the stabilizer bar engages a portion of each lead and provides stability and alignment to the assembled paired nanominiature connector leads. The stabilizer bar has a cross-section that enables it to be inserted between two rows of assembled nanominiature connector leads in such a manner as to not deform the leads. This is the insertion orientation phase. The stabilizer bar is then manually rotated to the engagement orientation allowing for the nanominiature connector leads to fit into the grooves and cutouts. In one embodiment, the grooves each have a pair of detents for gripping the leads. The detents hold the leads in place while these components are being mounted to a separate structure, such as a printed circuit board. Additionally, the detents permit the assembler to experience a "snap" when the leads are properly aligned. The stabilizer bar provides for alignment and stability in all directions. The stabilizer bar provides stability by maintaining the true positioning of the terminal ends of the nanominiature contact leads and provides for their easy attachment to a integrated circuit board without manually aligning each lead.

A stabilizer bar device for aligning and stabilizing nanominiature connector leads, for alignment with a printed circuit board, the stabilizer bar being a longitudinal member having a cross-section dimension that, when manually rotated to the insertion orientation, fits between two rows of nanominiature connector leads and may be inserted between these two rows of nanominiature connector leads without misaligning the leads. Manually turning a handle, formed in an end of the longitudinal member, brings the stabilizer bar into engagement with the paired nanominiature connector leads. Specifically, a first shoulder of the stabilizer bar formed along the length of the stabilizer bar has a first series of cutouts formed therein. The cutouts correspond with the outer or first row of leads. When the inserted stabilizer bar is rotated into engagement orientation, each cutout of the first shoulder of the stabilizer bar comes into contact with a leg of an individual lead of the first, outer row of fine pitch electronic leads and provides stability to each individual lead. A second shoulder, formed along the second of side of stabilizer bar, has a series of grooves formed therein and a pair of detents positioned within each of the grooves. When the stabilizer bar is rotated from the insertion position to the into the engagement orientation, the knees of the inner or second row of leads ride up and drop back in place between the paired detents. Thus the stabilizer bar provides stability to each individual lead. This dropping back in place of the leads into the grooves can be felt by the assembler and thereby signals that the leads are in the correct alignment. The detents keep the stabilizer bar rotated to the precise angle to maintain engagement of the nanominiature connector leads with the stabilizer bar. Epoxy may be added to secure the leads to the stabilizer bar.

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings exemplary constructions of the invention; however, the invention is not limited to the specific methods and instrumentalities disclosed. In the drawings:

FIG. 1 is a perspective view of the stabilizer bar in a position of use stabilizing and aligning micro connector leads;

FIG. 2 is an end view of FIG. 1;

FIG. 3 is a front view of FIG. 1;

FIG. 4A is an enlarged view of the end view of FIG. 1 with the stabilizer bar shown in a position of insertion orientation for insertion of the stabilizer bar into the series of micro connector leads;

FIG. 4B is an enlarged view of the end view of FIG. 1 with the stabilizer bar shown in a rotated position of use in an engagement orientation for stabilizing and aligning the micro connector leads;

FIG. 5 is a front view of the stabilizer bar with the series of grooves with detents shown;

FIG. 6 is a front view of the stabilizer bar of this invention with the series of cut-outs and grooves with detents shown;

FIG. 7 is a first end view of the stabilizer bar of this invention;

FIG. 8 is a second end view of the stabilizer bar of this invention;

FIG. 9 is a front view of the stabilizer bar of the invention with a series of cut-outs shown;

FIG. 10 is an enlarged view of the stabilizer bar indicated at 10 in FIG. 1; and FIG. 11 is a cross-sectional view of the stabilizer bar with detents holding the knee of the inner row of leads and with the cut-outs receiving the outer row lead above and below the knee.

DETAILED DESCRIPTION OF THE CURRENTLY PREFERRED EMBODIMENTS

A nanominiature connector typically refers to a fine pitch electronic connector, in particular, an electronic connector with leads 0.025 inches on center.

Understanding of the invention will be further enhanced by referring to the following illustrative but non-limiting examples.

Here presented is an alignment or stabilizer bar device for securing fine pitch leads, associated with micro electrical components, in position to prevent deformation to the leads during packaging, shipment and/or use. Deformation of leads could result in an electrical short within an electrical device. The alignment or stabilizer bar is separate from the connector leads. The stabilizer bar is a longitudinal element with evenly spaced pairs of grooves for receiving the spaced pairs of fine pitch leads, said grooves having a pair of detents for gripping the leads. The bar is inserted and rotated allowing for the fine connector leads to fill the grooves with detents for holding the leads in place while these components are being mounted to a printed circuit board. The alignment device provides for alignment and stability in the all directions. The alignment device provides stability by maintaining the true positioning of the terminal ends of the contacts.

The stabilizer bar 20, a length of non-conductive material, is shown in its position of use in FIG. 1. The alignment or stabilizer bar 20 is, in actual use conditions, formed of liquid crystal polymer by injection molding. However, other moldable insulators could be used as well. The stabilizer bar 20 is of a generally columnar shape with a pair of opposing planar sides 22, 24, shown at FIGS. 1, 5, 6 & 9 and in detail at FIG. 10. On each planar side is mounted a shoulder 28, 38. The stabilizer bar 20 is shown with a series of grooves 30 are formed in first shoulder 28 down the length of the bar 20 with detents 32 positioned in each groove 30, shown in detail at FIGS. 5 & 10. FIG. 6 is a profile view of stabilizer bar 20 with both the grooves 30 shown formed in first shoulder 28 and a series of cut-outs 40 formed in second shoulder 38. The second planar side 24 is shown in at FIG. 9 with second shoulder 38 and cutouts 40 indicated. Handle 50, for manually grasping the stabilizer bar 20, is shown protruding from the first end 52 of stabilizer bar 20. First end 52 is shown at FIG. 7 and a second end 58 are shown at FIG. 8. In use conditions, the planar sides, 22, 24 are grasped manually in addition to the handle 50 and used to manipulate the stabilizer bar 20 for insertion between a first outer row 70 of connector leads and a second inner row 80 of connector leads, FIGS. 1, 3, 4 & 10 and further to rotate the stabilizer bar 20 into an engagement position, FIGS. 1, 2, 4B, 10 and 11.

In use, stabilizer bar 20, which is configured to match the length and grooved to fit fine pitch electronic connector leads, is manually inserted between two rows of connector leads, first row connector leads 70 and second row connector leads 80, the insertion orientation of stabilizer bar is shown at FIG. 4A. After being inserted a precise depth, the device is rotated manually to engage the leads, FIG. 4B. Direction arrows are shown in FIGS. 4A & 4B to indicate rotation of the axis of the stabilizer bar 20 from the insertion orientation FIG. 4A, that allows the stabilizer bar 20 to be inserted between paired rows of connector leads without deforming these leads, to an engagement orientation, shown at FIG. 4B, where the individual leads are received by the grooves and cutouts, and the detents snapping into place holding fast the leads. In the engagement orientation, FIGS. 1, 2, 3, 4B and 10, the stabilizer bar 20 is rotated such that each of the cutouts and grooves with detents lineup with each of the rows of leads of the microelectronic connector and the detents perceivably snap into place when the stabilizer bar 20 positioned correctly within the two rows of leads. This snapping into place of the detents about the leads indicates that all the leads are correctly positioned and, because the leads are stabilized in their position by the stabilizer bar, eases the eventual installation of the leads onto a circuit board, or the like. Because the lead rows are intentionally produced closer together than desired, the instillation of the stabilizer bar 20 biases the leads outwardly into the desired alignment for easy later installation onto a circuit board because the stabilizer bar 20 acts to align and secure each fine pitch lead in position. The stabilizer bar 20, in use is placed between the rows of leads of an assembled nanominiature fine pitch connector. Once in place and the grooves and cutouts are lined up with the individual leads, the stabilizer bar 20 is manually rotated into engagement orientation so that the stabilizer bar 20 engages the leads and raises the knees 72 of the outer row 70 of microelectronic, or nanominiature, connector leads. At the same time, the stabilizer bar 20 biases outwardly the knees 82 of the inner row 80 of microelectronic, or nanominiature connector leads, thus the stabilizer bar 20 holds those connector leads in position preventing misalignment, and preventing bending of the delicate micro connector leads, shown at FIGS. 2, 4B, 10 & 11. When in position, the stabilizer bar 20 increases the rigidity at each contact by physically attaching each contact lead, and maintains the alignment of all contact leads at a position close to the mount surface of the circuit board, thus reducing the movement of the fine leads and eases the installation of the assembled stabilized nanominature fine pitch connector to the circuit board. The stabilizer bar 20 is inserted into the micro connector after the connector has been assembled but before being installed onto a circuit board or the like. Because the detents stick up once connector leads snap into place, the leads can't be moved because the detents hold them in place. Epoxy is optionally applied after installation of the stabilizer bar which, if used, further locks the stabilizer bar in position.

More specifically, in use, the stabilizer bar 20 is manually oriented for insertion and positioned adjacent the paired fine pitch nanominiature connector, such that the stabilizer bar 20 may be inserted between the rows of leads of the fine pitch micro connector, as shown in FIG. 4A. Once the cutouts 40 of the stabilizer bar 20 are aligned with the individual leads, as shown in FIG. 4A, the stabilizer bar 20 is manually rotated into engagement position, shown at FIG. 4B. Here the second shoulder 38 of stabilizer bar 20 engages a portion of the lead leg 73 below the knee 72 of the outer row of leads 70. Simultaneously, the detents 32, mounted within the grooves 30 formed on the first shoulder 28, snap into place about the knee 82 of the inner row of leads. The detents 32 in particular hold the inner row of leads 80 fast, shown in detail at FIG. 11. The all important feet 76, 86 of the leads are positioned by the stabilizer bar for eventual engagement with a circuit board or other device. Optional epoxy is applied once the stabilizer bar is oriented into engagement with the connector leads to prevent the leads from being pulled away. FIG. 2 is the side view of the stabilizer bar 20 in engagement with the pairs of connector leads. A close-up view of these connector leads engaging the stabilizer bar 20 is shown at FIGS. 10 & 11. When the stabilizer bar 20 is in position and rotated, the knees 72 of the outer row of the leads 70 are lifted up and drop back into the cutout 40 when the bar is correctly positioned. The stabilizer bar 20 momentarily pushes the knees 82 of the inner row of leads 80 away from the first row of leads 70 so that the knees rides up and drops back in place between the paired detents 32. This snapping back into place can be felt by the assembler. This lets the assembler know that the leads are correctly aligned. In the preferred embodiment, the assembled nanominiature connector has rows of leads with an orientation intentionally closer together than is needed in the finished application. Use of the stabilizer bar corrects this orientation. Epoxy is optionally applied to the portion of the leads touching the stabilizer bar and holds them in place.

Advantages of the invention include ease of alignment of the individual leads at their eventual point of use, be that a circuit board or other device, without the need to manually align each micro connector. Also, having the stabilizer bar in place prevents deformation of the individual leads during shipping, storage and eventual use.

Although the present invention has been described in considerable detail with reference to certain preferred embodiments, workers skilled in the art will recognize that change may be made in form and detail without departing from the spirit and scope of the invention; other versions are possible. For example, multiple stabilizer bars could be used between multiple rows of connector leads. Another example, the stabilizer bar could have grooves and cutout without detents. Also, the stabilizer bar could be used with larger electronic components. Therefore, the spirit and scope of the appended claims should not be limited to the description of the preferred versions contained herein.

What is claimed, it is:

1. An alignment device for aligning and stabilizing assembled fine pitch electronic component leads, for protecting the individual connector leads from being deformed during shipping and use, comprising:
   a) a non-conducting, longitudinally shaped, stabilizer bar having a first planar side and a second planar side for inserting between two rows of leads in a connector;
   b) means for inserting said stabilizer bar between the two rows of leads without deforming the leads; and
   c) means for attaching and holding fast each lead in two rows of leads to said stabilizer bar for providing alignment and stability of connector leads in all directions for easy alignment with an integrated circuit board without the need to manually align each connector lead.

2. The device of claim 1, wherein said stabilizer bar further comprises a cross-section dimension that, when manually rotated to the insertion orientation, can be inserted between two rows of connector leads with deforming the leads.

3. The device of claim 2, wherein said means for inserting said stabilizer bar between the two rows of leads further comprises:
   a) a handle formed in an end of said longitudinal member, for manually grasping and turning said longitudinal member; and
   b) a first and second planar sides of said longitudinal member, for further manual grasping.

4. The device of claim 3, wherein said means for inserting said stabilizer bar between the two rows of leads further comprises manually grasping said longitudinal element and rotating said element from an insertion orientation to an engagement orientation.

5. The device of claim 4, wherein said means for attaching and holding fast each lead in two rows of leads, further comprises:
   a) a first shoulder, aligned with said first planar side, said shoulder formed along the length of said stabilizer bar, said first shoulder having a series of grooves formed therein, when said stabilizer bar is rotated into engagement orientation, said first shoulder of said stabilizer bar comes into contact with a leg of the first row of fine pitch electronic leads and provides stability to each individual lead; and
   b) a second shoulder, aligned with said second planar side, said second shoulder formed along the length of said stabilizer bar, said second shoulder having a series of cutouts formed therein when said stabilizer bar is rotated into an engagement orientation, said second shoulder of said stabilizer bar comes into contact with a second row of fine pitch electronic leads and provides stability to each individual lead.

6. The device of claim 5, wherein said series of grooves further comprise detents mounted thereon to hold individual leads of the fine pitch electronic connector leads in place once said stabilizer bar is oriented into engagement position, said detents snapping into place to hold fast the connector leads.

7. The device of claim 6, further comprising application of epoxy to hold connector leads in position on said stabilizer bar once said stabilizer bar is positioned in an engagement orientation.

8. A stabilizer bar device of nonconductive material for aligning and stabilizing an assembled fine pitch electronic component connector leads for alignment with a printed circuit board, comprising
   a) a longitudinal member having a cross-section dimension that, when manually rotated to the insertion orientation, may be inserted between two rows of connector leads;
   b) a handle formed in an end of said longitudinal member for manually grasping and turning said longitudinal member;
   c) said longitudinal member, after being inserted between two rows of connector leads, may be manually rotated to an engagement orientation;
   d) a first shoulder, formed on a first planar side of said longitudinal member along the length of said longitudinal member, said first shoulder having a series of grooves formed therein with a pair of detents within each of said grooves, when said longitudinal member is rotated into engagement orientation, said detents come into contact with the leads providing stability to each individual lead; and e) a second shoulder, formed along the length of said longitudinal member, which has a second planar side with said second shoulder having a series of cutouts formed when said longitudinal member is rotated into an engagement orientation, said second shoulder of said longitudinal member comes into contact with a second row of fine pitch electronic providing stability to each individual lead.

9. The device of claim 8, wherein said stabilizer bar is configured to match the length and grooved to fit fine pitch electronic connector leads.

10. The device of claim 9, wherein said detents hold individual leads of the fine pitch electronic connector leads in place once said stabilizer bar is oriented into an engagement position.

11. The device of claim 10, further comprising application of epoxy to hold connector leads in position on said stabilizer bar once said stabilizer bar is positioned in an engagement orientation within the micro electrical connector.

* * * * *